US011151021B2

(12) United States Patent
Gal et al.

(10) Patent No.: US 11,151,021 B2
(45) Date of Patent: Oct. 19, 2021

(54) SELECTING TEST-TEMPLATES USING TEMPLATE-AWARE COVERAGE DATA

(71) Applicant: International Business Machines Corporation, Armonk, NY (US)

(72) Inventors: Raviv Gal, Kamon (IL); Giora Simchoni, Bethlehem Haglilit (IL); Avi Ziv, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 263 days.

(21) Appl. No.: 16/409,913

(22) Filed: May 13, 2019

(65) Prior Publication Data

US 2020/0364134 A1 Nov. 19, 2020

(51) Int. Cl.
*G06F 11/00* (2006.01)
*G06F 11/36* (2006.01)
*G06F 16/906* (2019.01)

(52) U.S. Cl.
CPC ...... *G06F 11/3676* (2013.01); *G06F 11/3684* (2013.01); *G06F 16/906* (2019.01)

(58) Field of Classification Search
CPC ............ G06F 11/3676; G06F 11/3684; G06F 11/3447; G06F 11/3452
See application file for complete search history.

(56) References Cited

U.S. PATENT DOCUMENTS

| 6,356,858 | B1 * | 3/2002 | Malka | G06F 11/3676 |
| | | | | 702/186 |
| 7,331,007 | B2 * | 2/2008 | Fine | G01R 31/318357 |
| | | | | 703/13 |
| 7,865,340 | B2 * | 1/2011 | Fine | G06F 30/3323 |
| | | | | 703/2 |
| 8,019,586 | B2 * | 9/2011 | Fournier | G01R 31/31835 |
| | | | | 703/14 |
| 8,121,827 | B2 * | 2/2012 | Azatchi | G06F 30/20 |
| | | | | 703/19 |
| 8,756,574 | B2 * | 6/2014 | Ziv | G06F 1/14 |
| | | | | 717/124 |
| 8,903,700 | B2 * | 12/2014 | Chockler | G06F 9/44 |
| | | | | 703/20 |
| 9,594,672 | B1 * | 3/2017 | Dusanapudi | G06F 11/3684 |
| 9,891,281 | B1 | 2/2018 | Kinderman et al. | |
| 10,699,046 | B2 * | 6/2020 | Green | G06N 20/00 |
| 10,929,268 | B2 * | 2/2021 | Bhat | G06K 9/6269 |

(Continued)

*Primary Examiner* — Elmira Mehrmanesh
(74) *Attorney, Agent, or Firm* — Barry D. Blount

(57) ABSTRACT

An example system includes a processor to receive a template-aware coverage data that tracks probabilities of events in a list of events being hit for a set of test-templates over a first and second predetermined period of time. The processor is to generate a hit prediction score for each combination of unhit event in the events and each test-template in the set of test-templates of the second predetermined period of time. The hit prediction score indicates a probability of an unhit event being hit by a particular test-template in a future third predetermined period of time based on the template-aware coverage data and similarities between the events and the test-templates. The processor is to generate a template score for each test-template based on the hit prediction scores for each test-template. The processor is to select a test-template from the set of test-templates based on the template score.

17 Claims, 7 Drawing Sheets

(56) References Cited

U.S. PATENT DOCUMENTS

| | | | |
|---|---|---|---|
| 2003/0093716 A1* | 5/2003 | Farchi | G06F 11/3676 |
| | | | 714/34 |
| 2006/0048026 A1 | 3/2006 | Fine et al. | |
| 2006/0066339 A1* | 3/2006 | Rajski | G01R 31/2894 |
| | | | 324/762.02 |
| 2013/0007528 A1* | 1/2013 | Ziv | G06F 1/14 |
| | | | 714/37 |
| 2013/0117722 A1 | 5/2013 | Biswas et al. | |
| 2013/0311962 A1* | 11/2013 | Chatterjee | G06F 30/331 |
| | | | 716/111 |
| 2014/0115396 A1 | 4/2014 | Fournier et al. | |
| 2017/0091071 A1* | 3/2017 | Chitale | G06F 11/008 |
| 2017/0178019 A1* | 6/2017 | Duggan | G06N 7/00 |
| 2017/0192880 A1* | 7/2017 | Ramakrishnan | G06F 11/3672 |
| 2019/0102277 A1* | 4/2019 | Walenstein | G06N 5/003 |
| 2019/0266074 A1* | 8/2019 | Copty | G06F 11/3684 |
| 2019/0294525 A1* | 9/2019 | Scheiner | G06F 11/3608 |
| 2020/0133830 A1* | 4/2020 | Sharma | G06Q 10/06312 |

\* cited by examiner

200

SELECTING TEST-TEMPLATES USING TEMPLATE-AWARE COVERAGE DATA

BACKGROUND

The present techniques relate to verification of hardware designs. More specifically, the techniques relate to selecting test-templates to be used for testing hardware designs.

SUMMARY

According to an embodiment described herein, a system can include processor to receive template-aware coverage data that tracks probabilities of events in a list of events being hit for a set of test-templates over a first and second predetermined period of time. The processor can also further generate a hit prediction score for each combination of unhit events in the list of events and test-template in the set of test-templates of the second predetermined period of time. The hit prediction score indicates a probability of an unhit event being hit by a particular test-template in a future third predetermined period of time based on the template-aware coverage data and similarities between the events and the test-templates. The processor can also generate a template score for each test-template based on the hit prediction scores for each test-template. The processor can further select a test-template from the set of test-templates based on the template score.

According to another embodiment described herein, a method can include receiving, via a processor, a template-aware coverage data that tracks probabilities of events in a list of events being hit for a set of test-templates over a first and second predetermined period of time. The method can further include generating, via the processor, a hit prediction score for each combination of unhit event in the list of events and test-template in the set of test-templates of the second predetermined period of time. The hit prediction score indicates a probability of an unhit event being hit by a particular test-template in a future third predetermined period of time based on the template-aware coverage data and similarities between the events and the test-templates. The method can also further include generating, via the processor, a template score for each test-template based on the hit prediction scores for each test-template. The method can also include selecting, via the processor, a test-template from the set of test-templates based on the template score.

According to another embodiment described herein, a computer program product for selecting test-templates can include computer-readable storage medium having program code embodied therewith. The computer readable storage medium is not a transitory signal per se. The program code executable by a processor to cause the processor to receive a template-aware coverage data that tracks probabilities of events in a list of events being hit for a set of test-templates over a first predetermined period of time and a second predetermined period of time. The program code can also cause the processor to generate a hit prediction score for each combination of unhit event in the list of events and test-template in the set of test-templates of the second predetermined period of time. The hit prediction score indicates a probability of an unhit event being hit by a particular test-template in a future third predetermined period of time based on the template-aware coverage data and similarities between the events and the test-templates. The program code can also cause the processor to generate a template score for each test-template based on the hit prediction scores for each test-template. The program code can also cause the processor to select a test-template from the set of test-templates based on the template score.

DETAILED DESCRIPTION

Figure 1:
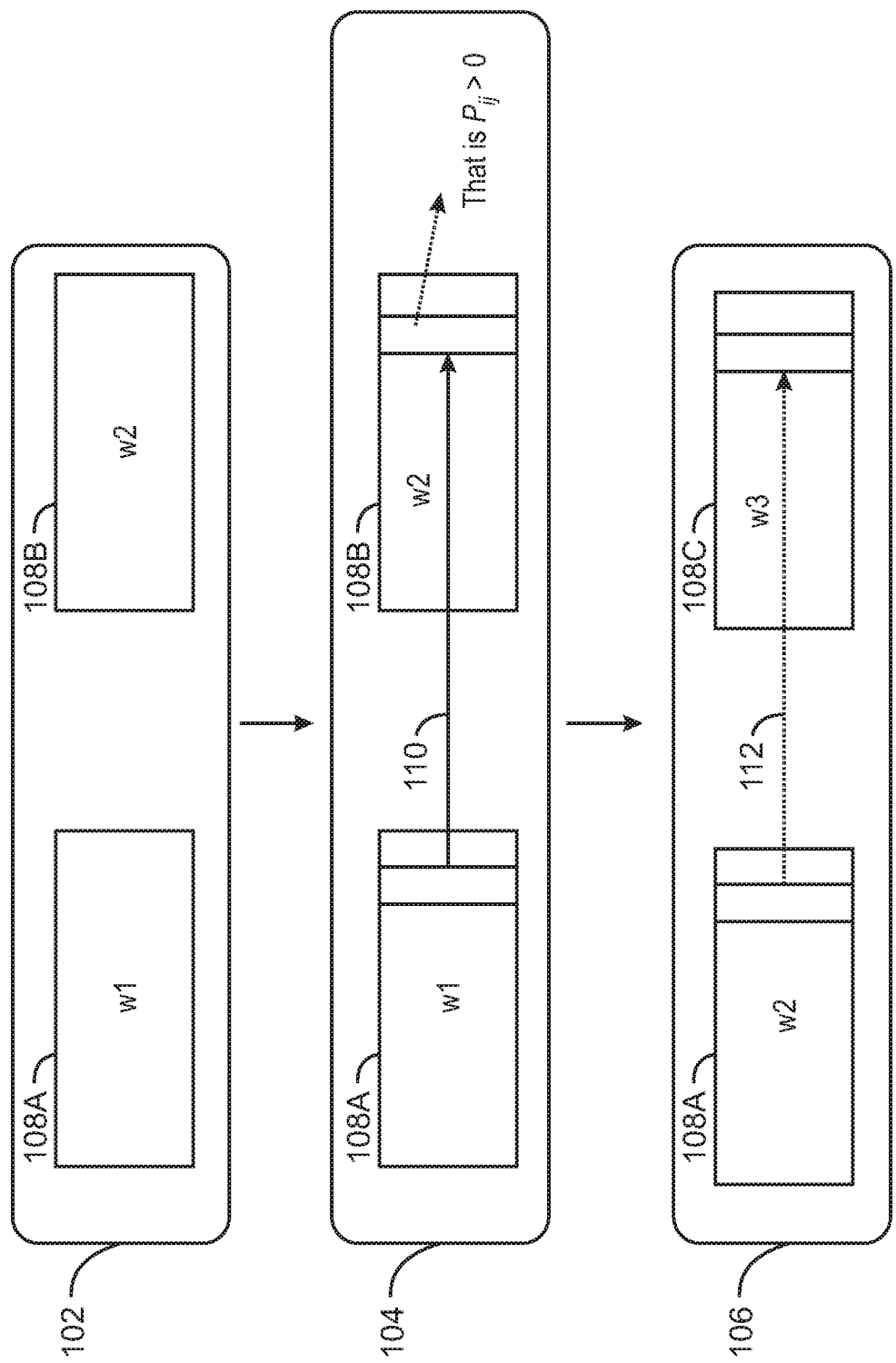
FIG. 1 is a flow diagram of an example process for predicting zero-to-hit events.

Electronic design automation (EDA), also referred to as electronic computer-aided design (ECAD), is a category of software tools for designing electronic systems such as integrated circuits and printed circuit boards. The tools work together in a design flow that chip designers use to design and analyze entire semiconductor chips.

Functional verification is a task in EDA that verifies that a logic design conforms to a specification. Functional verification may be a complex task, and may take the majority of time and effort in most large electronic system design projects. Functional verification is a part of more encompassing design verification, which, besides functional verification, considers non-functional aspects like timing, layout and power. Different coverage metrics may be defined to assess that the design has been adequately exercised. For example, these include functional coverage metrics that determine whether every functionality of the design been exercised, statement coverage metrics that are used to determine whether each line of hardware description language (HDL) been exercised, and branch coverage metrics that are used to determine whether each direction of every branch been exercised.

A difficult and time-consuming task encountered during functional verification of electronic designs is reaching coverage closure. Coverage closure is a point in functional verification when a functional coverage goal is met. For example, it may be possible to achieve 100% code coverage, but less than 100% functional coverage. Thus, a functional coverage goal may be 80%, 90%, or 100%. These figures may represent confidence that the functionality of an electronic system is correct. Reaching coverage closure may thus include hitting coverage events that have not been hit before during verification. Coverage events are events or sequences of events that automatically trigger coverage sampling. An event is hit when the particular event is encountered during testing and thus triggers coverage sampling. Events that have not been hit during a period of time are referred to herein as unhit events, or zero-hit events, and may include events that are not hit or events that aged-out during testing during the period of time. An aged-out event is one that was hit in the past, but has not been hit in the last period of time. Understanding why unhit events have not been hit and how unhit events can be hit may involve both verification expertise and a deep understanding of the design under test. Moreover, creating tests or test-templates that hit unit events may be an iterative trial and error process that may consume significant time from the verification team.

Some techniques for coverage directed generation (CDG), or automatic generation of tests or test-templates, have been proposed to tackle the CDG problem ranging from formal methods, via AI algorithms, to data analytics and machine learning techniques. However, these proposed techniques have various drawbacks, including the scalability of the solution, difficulty in applying them, and quality of the proposed solution. As a result, reaching coverage closure largely remains a manual process.

According to embodiments of the present disclosure, a processor can select test-templates using template-aware coverage data. For example, a system may include a processor to receive template-aware coverage data that tracks probabilities of events in a list of events being hit for a set of test-templates over a first predetermined period of time and second predetermined period of time. The template-aware coverage data may include a TAC matrix (i, j), wherein each entry in the TAC matrix is the probability of template i to hit event j. The processor may also generate a hit prediction score for each combination of unhit event in the events and test-template in the set of test-templates of the second predetermined period of time. The hit prediction score may indicate a probability of an unhit event being hit by a particular template in a future third predetermined period of time based on the template-aware coverage data and similarities between the events and the test-templates. The processor may also generate a template score for each test-template based on the hit prediction scores for each test-template. The processor may then select a test-template from the set of test-templates based on the template score. In some examples, the processor may execute the selected test-template to hit an unhit event during testing.

Thus, embodiments of the present disclosure enable improved coverage of events in verification and testing of hardware designs. Discovery of any issues at verification may save costs and time associated with fixing issues discovered during the testing at the pre-silicon phase. Moreover, some issues may otherwise never be discovered during testing, and thus the present techniques also improve reliability of the tested system. In some examples, a list of predicted unhit events may be used to avoid testing events that are not hittable by current test-templates. Time and resources may be saved by not testing unhittable events. New test-templates may then later be formulated and tested using the present techniques for these unhittable events.

With reference now to FIG. 1, example process 100 for predicting zero-to-hit events is shown in three blocks 102, 104, and 106. At block 102, a template-aware coverage (TAC) matrix for a first week 108A and a TAC matrix for a second week 108B are received. The TAC matrices 108A and 108B may include a number of rows corresponding to test-templates and a number of columns corresponding to events. Test-templates, as used herein, refer to instructions to be used for testing a particular system. For example, test-templates may be input into test generators to generate test instances to simulate a particular silicon design for a processor and determine whether particular specifications are met. Events, as used herein, refer to coverage events collected during simulation and may include hit events that were tested in a given time period and unhit events that were not tested in a given time period. For example, the time period may be a week. The events may include specific conditions being met at a design block of a processor. Events may also include more architectural events, such as an architectural instruction being detected. The architecture of the processor is described in the specification, which is public. For example, the instruction set (ISA) supported by a processor is part of its architecture. In some examples, coverage events can be classified into three groups. A first group may include: architecture events, including events that also can be seen when using the processor. For example, an architecture event may include that "we have integer multiplication instruction with first operand positive, and second negative." A second group may include micro-architecture level events relating to a micro-architecture level, such as a "branch prediction" mechanism. A third group may include implementation-level events, including events targeting low level implementation issues. In some examples, the TAC matrices 108A and 108B may have hundreds of thousands of events. For example, the TAC matrices may be similar to the TAC matrix 200 of FIG. 2. At block 104, a determination is made as to which events changed from zero in the TAC matrix 108A to hit in the TAC matrix 108B. As used herein, a zero refers to an event being unhit by any of the test-templates in a given time period. For example, a zero may be represented in a TAC matrix by an all-zero column for a particular event, indicating that none of the test-templates caused the particular event to be hit in a particular time period of simulation. As one example, the time period may be a week. A hit refers to at least one value in a column being greater than zero. For example, if hits are indicated using 1 and unhit events are indicated by zeroes, then a hit for a particular event may be a column that contains at least one value of one. As indicated by an arrow 110, zero events from TAC matrix 108A may be compared with the same events in TAC matrix 108B to detect events that changed from zero in TAC matrix 108A to hit in TAC matrix 108B.

At block 106, as indicated by an arrow 112, a prediction is made as to which zero events from TAC matrix 108B will become hit events in TAC matrix 108C. For example, the prediction may be made based on detected similarities between hit events and non-hit events and between test-templates. In some examples, a policy may be generated including a number N of test-templates having higher probability of producing a hit event in the TAC matrix 108C of week 3.

The process flow diagram of FIG. 1 is not intended to indicate that the operations of the process 100 are to be executed in any particular order, or that all of the operations of the process 100 are to be included in every case. Additionally, the process 100 can include any suitable number of additional operations. For example, the process 100 may include generating a policy including selected test-templates and executing the selected test-templates to hit unhit events during testing.

Figure 2:
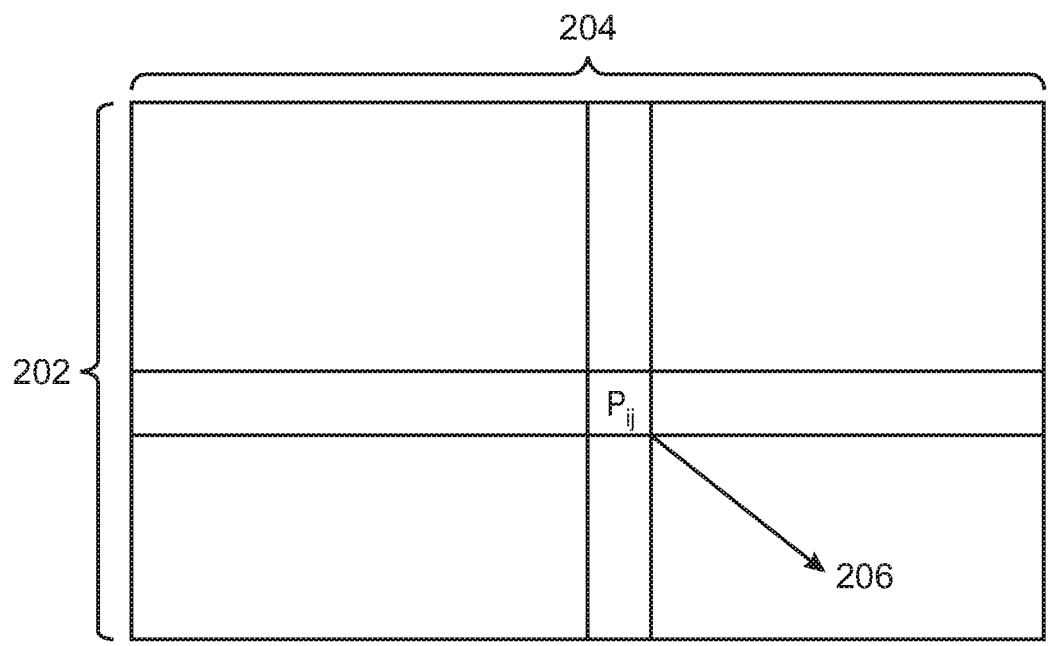
FIG. 2 is a block diagram of an example template-aware coverage (TAC) matrix that can be used to track the probability of events being hit by a test-template or a set of test-templates.

FIG. 2 is a block diagram shows an example template-aware coverage (TAC) matrix that can be used to track the probability of events being hit by a by a test-template or a set of test-templates. The example TAC matrix 200 can be used in the process 100 of FIG. 1, the process 300 of FIG. 3, the method 400 of FIG. 4, the computing device 500 of FIG. 5, or the computer-readable medium 600 of FIG. 6. FIG. 2 includes a number of test-templates 202 represented by rows and a number of events represented by columns. A value $P_{ij}$ of the TAC matrix 200 indicates an observed probability of a particular test-template i hitting a particular event j.

In the example of FIG. 2, the TAC matrix 200 may be generated periodically for a given system being tested. The generated TAC matrices 200 may then be compared to detect newly hit events, as discussed herein. The newly detected events can be used to generate a policy including test-templates that are more likely to generate hits on unhit events in the future. For example, the test-templates may be selected based on similarity to test-templates that caused newly detected hits or similarity between events, such as similarities between unhit and hit events. The newly hit events may thus be learned from to predict tests that will increase the probability to hit these unhit events.

It is to be understood that the block diagram of FIG. 2 is not intended to indicate that the TAC matrix 200 is to include all of the components shown in FIG. 2. Rather, the TAC matrix 200 can include fewer or additional components not illustrated in FIG. 2 (e.g., additional test-templates, events, or additional probabilities, etc.).

Figure 3A:
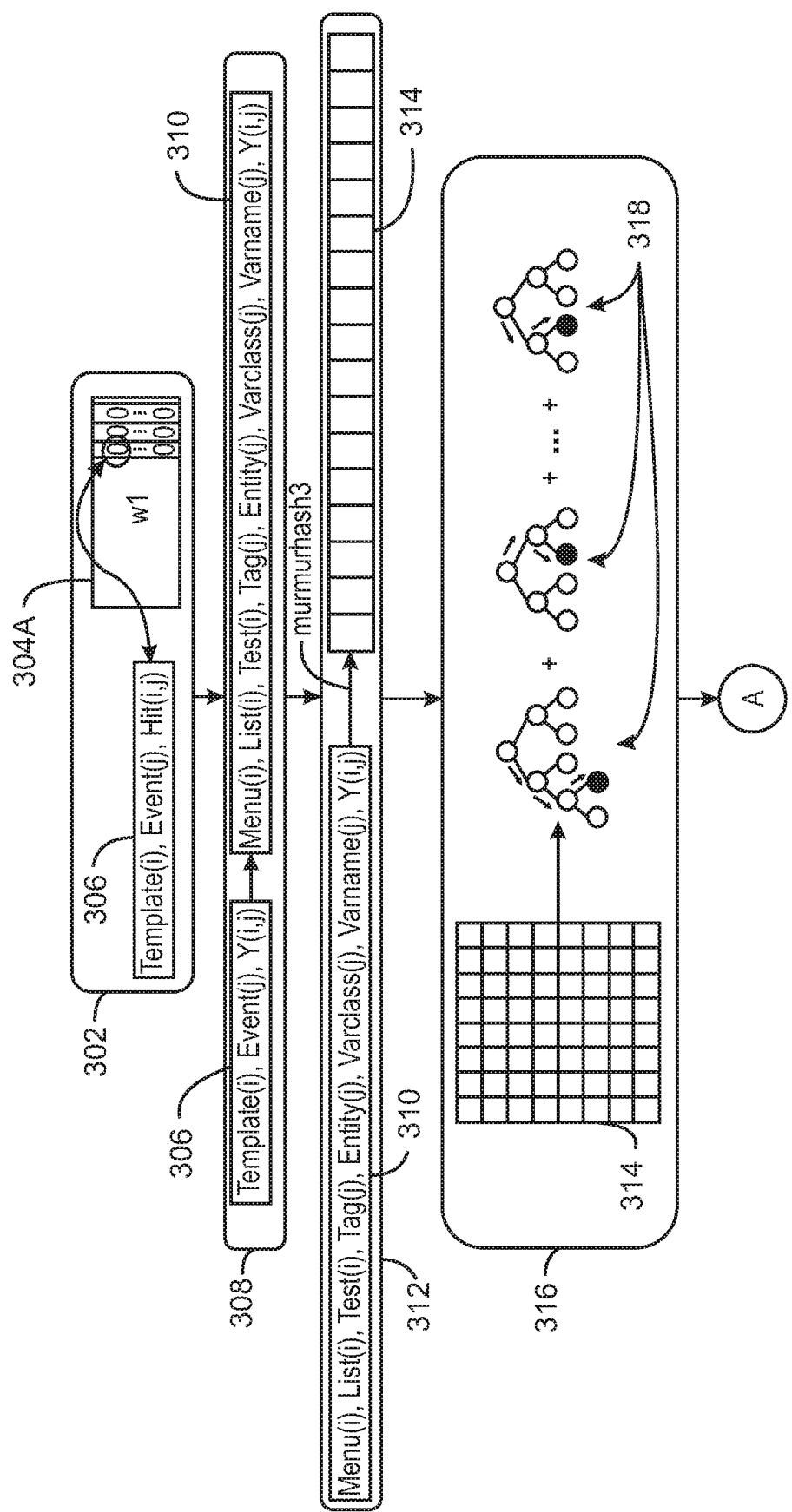
FIG. 3A is a flow diagram of an example process for selecting test-templates for hitting unhit events.

FIG. 3A is a flow diagram of an example process for selecting test-templates for hitting unhit events. The process 300 can be used to perform the method 400 of FIG. 4 using the processor 502 of the computing device 500 of FIG. 5 or the processor 602 coupled to the computer-readable medium 600 of FIG. 6.

At block 302, a set of test-templates and a template-aware coverage matrix 304A is received. A training set 306 may be generated by selecting unhit events in the TAC matrix 304A. For example, the training set 306 may be a list of events and associated test-templates causing the event to be not hit or hit, as indicated by a zero or a one. In the example of FIG. 3A, <template(i),event(j)> are the features, and Y(I,j) is the label. As one example, 400,000 cells from a week 1 unhit zero area may be associated with unhit events. For example, the 400,000 cells may include 200,000 "Z2Z" cells indicating events that were unhit in week 0 and remain unhit in week 1, and 200,000 "Z2H" cells indicating newly hit events in week 1 when compared to previously unhit events in week 0. In this example, the 400,000 cells may be input into a trained classifier to classify each of the 400,000 cells as Z2H or not Z2H. In various examples, a hit may be detected in response to detecting that a threshold is exceeded. In some examples, the threshold may be p=0. Thus, any probably of a hit may be detected as a hit and indicated by a one. In some examples, the threshold may be increased to include higher probability hits. For example, the threshold may be increased to p=0.1.

At block 308, a number of tokens are extracted as features from the names of the test-templates and the names of events that were unhit in week 0. For example, these events include the Z2H events and the Z2Z events. As used herein, a token refers to a part or a substring of the test-template or event name. For example, the tokens may be generated by parsing the names of the test-templates and events. As one example, the parsed names may include template names, template-group names, event names, and event tags. For example, in FIG. 3A some examples, parsed names are menu, list, test, tag, entity, varclass, and varname. In some examples, the names may have naming conventions in which multiple words are joined by underscores or capitalized. The individual words from these names may be extracted as separate features. The extracted features may be organized into one long list to be hashed.

At block 312, the list of extracted features is hashed. For example, the list may be filtered using the murmurhash3 hash. The murmurhash3 hash function may be a feature hashing with a size of $2^{22}$ that results in a set of hashed features of over 4 million features. The feature hashing may work by applying a hash function to the features and using their hash values as indices directly, rather than looking the indices up in an associative array. Feature hashing may thus be used as a fast and space-efficient way of vectorizing features. Vectorizing features involves turning arbitrary features into indices in a vector or matrix. The hashed features may be smaller in size than the extracted features and thus may enable more efficient processing. Moreover, multiple extracted tokens may be mapped to a single hash, thus resulting in further efficiency. In addition, feature hashing allows new features to be included in the W2 matrix. In some examples, feature hashing is used when new features are added between training and deploying. For example, the new features can be a new tags added to some of the events.

At block 316, training data is used to train a classifier 318. For example, the training data may be the extracted features 314. In various examples, the classifier 318 can be any machine learning model. For example, the classifier 318 may be a two-class classifier. A two-class classifier predicts two classes. In the example of FIG. 3A, the two-class classifier may predict case 0 (Z2Z) or 1 (Z2H). In various examples, the classifier 318 computes a score in the range [0, 1] that can be translated to 0 or 1 using a threshold. For example, if the score is greater than a threshold of 0.8, then the classifier may classify as class 1. As another example, the two-class classifier may perform a two-class Classification with Gradient Boosted Trees, which may be boosted using the XGBOOST gradient boosting framework, released Mar. 27, 2014. For example, the classifier may use many decision trees, which are then combined to produce a two-class classification. In various examples, the score is used to select the best test-templates.

Figure 3B:
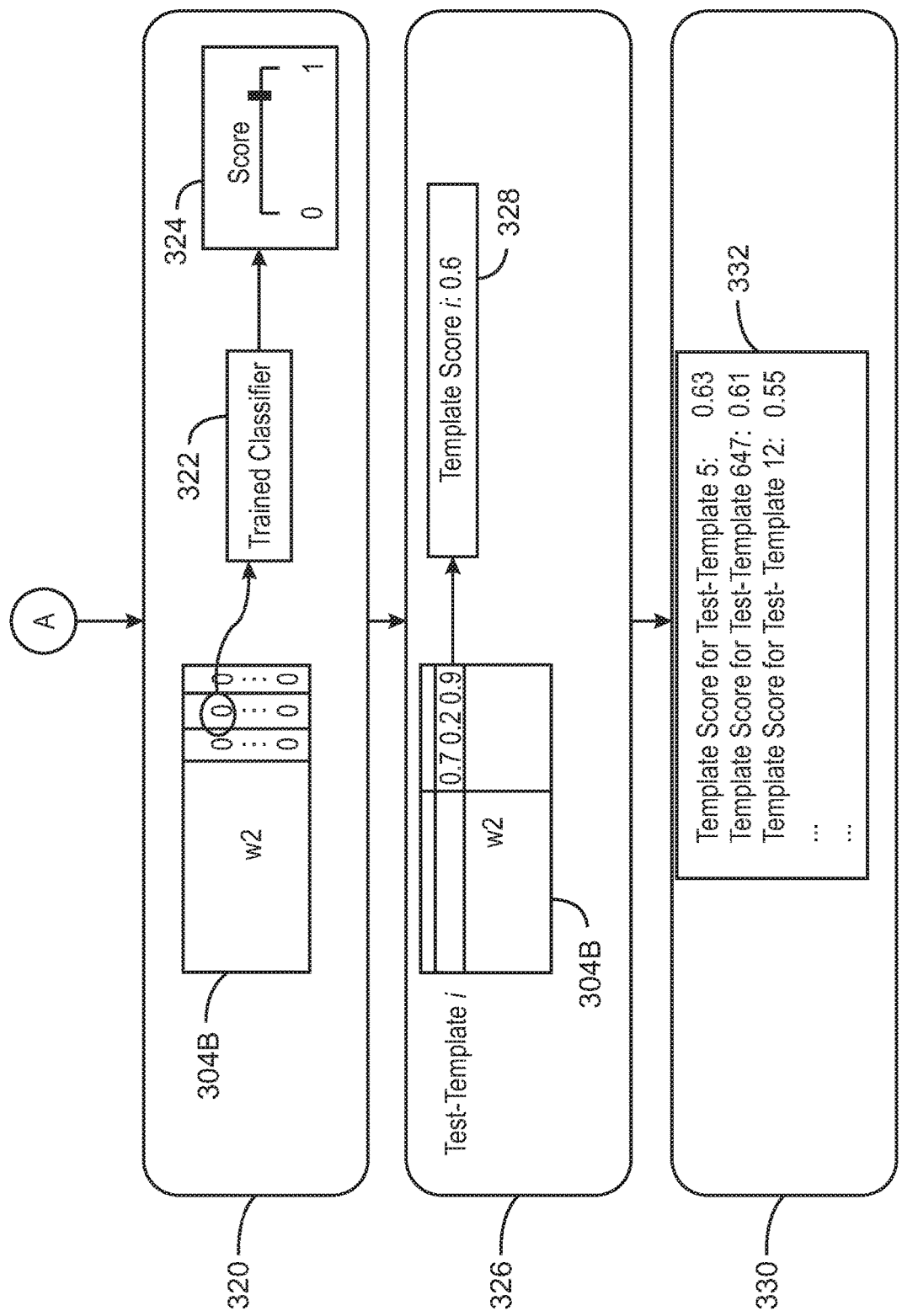
FIG. 3B is a continuation of the flow diagram of FIG. 3A showing the example process for selecting test-templates for hitting unhit events.

FIG. 3B is a continuation of the flow diagram of FIG. 3A showing the example process for selecting test-templates for hitting unhit events. The continuation is indicated by a circled A.

At block 320, a TAC matrix 304B from week 2 is input into a trained classifier 322. For example, the trained classifier 322 may be the XGBoost classifier. The trained classifier 322 predicts a hit prediction score for each combination of the test-template and zero hit event in the TAC matrix 304B from week 2. The score may indicate probability of an event being a zero-to-hit event in week 3 for each test-template. The output hit prediction score may have a value in the range from 0 to 1, with 0 indicating an event being unhit and 1 indicating an event being hit. Thus, a label of Y(I, j)=1 may be generated for events that went from 0 to hit in W2.

At block 326, an average template score 328 is calculated for each of the test-templates based on the output scores from the classifier 322. For example, the average template score 328 for a particular test-template can be calculated by averaging the scores of the events for that test-template. As one example, test-template i in TAC matrix 304B may be associated with the hit prediction scores 0.7, 0.2, and 0.9. The resulting average template score 328 for test-template i may thus be 0.6.

At block 330, a list of test-templates is output. For example, the list may be a predetermined number of test-templates with higher average template scores than the other test-templates. In some examples, the list of test-templates may be ordered by descending average template score. In the example of FIG. 3B, the average template score of test-template 5 is 0.63, the template score of test-template 647 is 0.61, and the template score for test-template 12 is 0.55. In various examples, the list of test-templates may be part of a policy to be used for testing. As one example, test-templates with an average template score exceeding a threshold score may be included in the policy. For example, the threshold score in the example of FIG. 3B may have been 0.54. In various examples, the threshold score may be adjusted to increase or decrease the size of the policy. Thus, test-templates more likely to result in hits of events previously unhit in previous weeks may be executed or provided more resources to increase coverage. In some examples, test-templates with higher average template scores may be provided greater resources during testing.

The flow diagram of FIGS. 3A and 3B is not intended to indicate that the operations of the method 300 are to be executed in any particular order, or that all of the operations of the method 300 are to be included in every case. Additionally, the method 300 can include any suitable number of additional operations.

Figure 4:
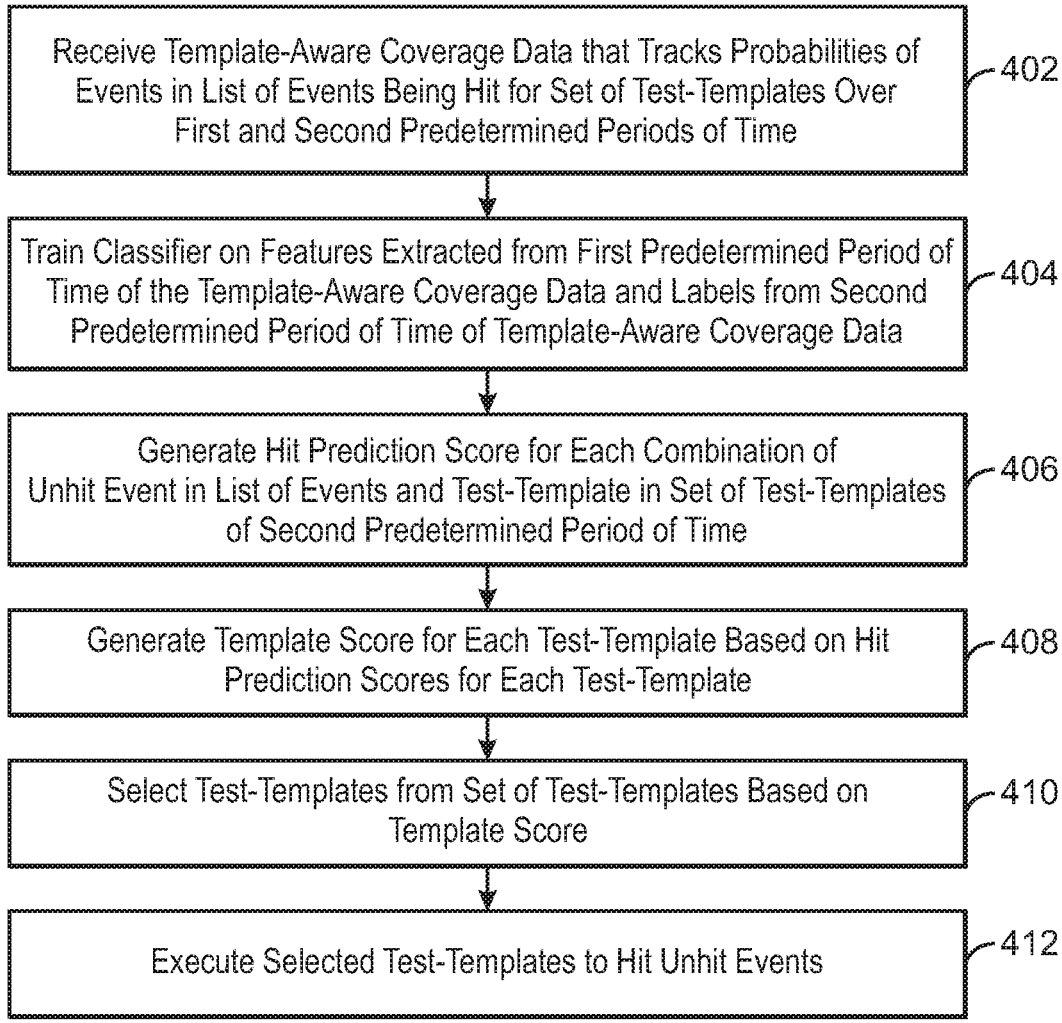
FIG. 4 is a process flow diagram summarizing an example method of selecting test-templates to be executed to hit unhit events.

FIG. 4 is a process flow diagram summarizing an example method of selecting test-templates to be executed to hit unhit events. The method 400 can be implemented with any suitable computing device, such as the computing device 500 of FIG. 5, or the processor 602 of the computer-readable medium 600 of FIG. 6.

At block 402, template-aware coverage data that tracks probabilities of events in a list of events being hit for a set of test-templates over a first and second predetermined period of time is received. As one example, a predetermined periods of time may each be a week. For example, the template-aware coverage data may be data gathered from two consecutive weeks. In various examples, the template-aware coverage data may be a template-aware coverage matrix including a number of test-templates and events with associated hit or unhit status.

At block 404, a classifier is trained on features extracted from a first predetermined period of time of the template-aware coverage data and labels from a second predetermined period of time of the template-aware coverage data. For example, the features may be names of events or tags. The labels may be hit and unhit labels. In various examples, the first predetermined period of time and the second predetermined period of time may be a week. For example, the first predetermined period of time and the second predetermined period of time may be two consecutive weeks.

At block 406, a hit prediction score is generated for each combination of unhit event in the list of events and test-template in the set of test—templates of the second predetermined period of time. The hit prediction score indicates a probability of an unhit event being hit by a particular test-template in a future third predetermined period of time based on the template-aware coverage data and similarities between the events and the test-templates. For example, a TAC matrix for the second predetermined period of time may have features extracted and input into a trained classifier. The trained classifier may output the hit prediction score for each test-template with respect to each event. In some examples, the template-aware coverage data is input into a trained classifier. For example, the trained classifier may be trained to generate hit prediction scores using extracted features from template-aware coverage data of the first predetermined period of time. In various examples, features are extracted from the template-aware coverage data of the first predetermined period of time, the extracted features are hashed, and the hashed extracted features are input into a trained classifier. For example, features may be extracted from the template-aware coverage data of the first predetermined period of time based on the names of the events and the test-templates and labels extracted from template-aware coverage data of the second predetermined period of time. In some examples, the trained classifier may be trained using regression, such as linear regression or logistic regression.

At block 408, a template score is generated for each test-template based on the hit prediction scores for each test-template. In some examples, the hit prediction scores associated with each test-template are averaged to generate the template score for each test-template.

At block 410, test-templates are selected from the set of test-templates based on the template score. For example, test-templates with template scores exceeding a threshold score may be selected. In some examples, a predetermined number of test-templates with higher scores than other test-templates may be selected.

At block 412, the selected test-templates are executed to hit an unhit event. For example, the selected test-template may be included in a policy with other test-templates and used to test a particular processor design.

The process flow diagram of FIG. 4 is not intended to indicate that the operations of the method 400 are to be executed in any particular order, or that all of the operations of the method 400 are to be included in every case. Additionally, the method 400 can include any suitable number of additional operations. For example, the test-template may be executed to hit an unhit event during testing, wherein an amount of a resource provided to the test-template during testing is based on the template score associated with the test-template. In some examples, the method 400 may include generating a policy including the test-template with other test-templates, and transmitting the policy to a tester. In some examples, the test-template is included in the policy in response to detecting that the template score of the test-template exceeds a threshold score. The test-templates with higher scores in the policy may also be allocated more resources during testing. The amount of resources to be allocated to each test-template may also be specified in the policy. In various examples, a list of predicted unhit events may also be generated. For example, the list of predicted unhit events may be clustered for readability. In various examples, the list of unhit events may be used to avoid testing events that are not hittable by current test-templates. Time and resources may be saved by not testing unhittable events.

Figure 5:
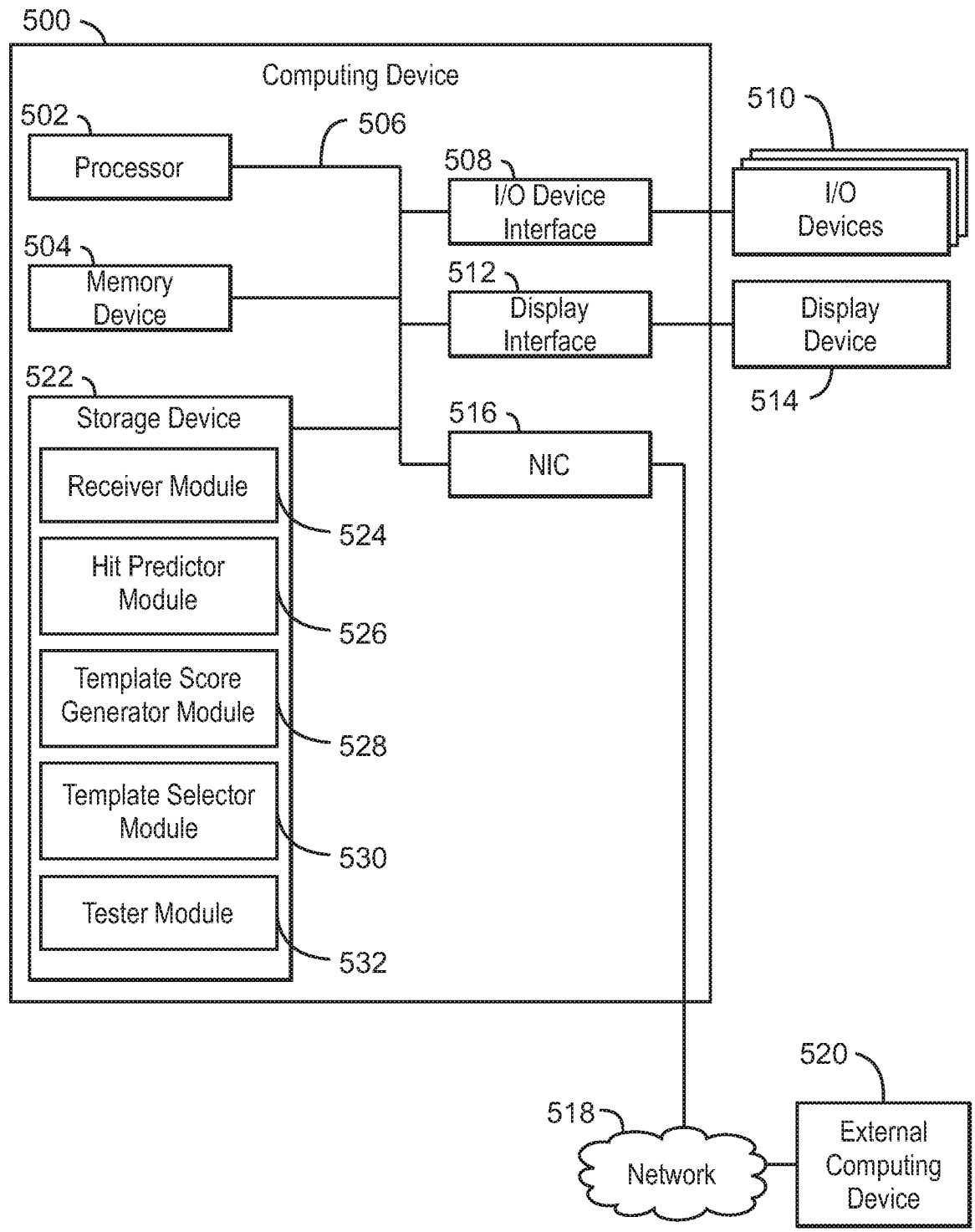
FIG. 5 is a block diagram of an example computing device that can select and execute test-templates for hitting unhit events.

FIG. 5 is block diagram of an example computing device that can select test-templates to be executed to hit unhit events. The computing device 500 may be for example, a server, desktop computer, laptop computer, tablet computer, or smartphone. In some examples, computing device 500 may be a cloud computing node. Computing device 500 may be described in the general context of computer system executable instructions, such as program modules, being executed by a computer system. Generally, program modules may include routines, programs, objects, components, logic, data structures, and so on that perform particular tasks or implement particular abstract data types. Computing device 500 may be practiced in distributed cloud computing environments where tasks are performed by remote processing devices that are linked through a communications network. In a distributed cloud computing environment, program modules may be located in both local and remote computer system storage media including memory storage devices.

The computing device 500 may include a processor 502 that is to execute stored instructions, a memory device 504 to provide temporary memory space for operations of said instructions during operation. The processor can be a single-core processor, multi-core processor, computing cluster, or any number of other configurations. The memory 504 can include random access memory (RAM), read only memory, flash memory, or any other suitable memory systems.

The processor 502 may be connected through a system interconnect 506 (e.g., PCI®, PCI-Express®, etc.) to an input/output (I/O) device interface 508 adapted to connect the computing device 500 to one or more I/O devices 510. The I/O devices 510 may include, for example, a keyboard and a pointing device, wherein the pointing device may include a touchpad or a touchscreen, among others. The I/O devices 510 may be built-in components of the computing device 500, or may be devices that are externally connected to the computing device 500.

The processor 502 may also be linked through the system interconnect 506 to a display interface 512 adapted to connect the computing device 500 to a display device 514. The display device 514 may include a display screen that is a built-in component of the computing device 500. The display device 514 may also include a computer monitor, television, or projector, among others, that is externally connected to the computing device 500. In addition, a network interface controller (NIC) 516 may be adapted to connect the computing device 500 through the system interconnect 506 to the network 518. In some embodiments, the NIC 516 can transmit data using any suitable interface or protocol, such as the internet small computer system interface, among others. The network 518 may be a cellular network, a radio network, a wide area network (WAN), a local area network (LAN), or the Internet, among others. An external computing device 520 may connect to the computing device 500 through the network 518. In some examples, external computing device 520 may be an external web-server 520. In some examples, external computing device 520 may be a cloud computing node.

The processor 502 may also be linked through the system interconnect 506 to a storage device 522 that can include a hard drive, an optical drive, a USB flash drive, an array of drives, or any combinations thereof. In some examples, the storage device 522 may include a receiver module 524, a hit predictor module 526, a template score generator module 528, a template selector module 530, and a tester module 532. The receiver module 524 can receive a template-aware coverage data that tracks probabilities of events in a list of events being hit for a set of test-templates over a first and second predetermined period of time. For example, the template-aware coverage data may be a template-aware coverage matrix. The hit predictor module 526 can generate a hit prediction score for each combination of unhit events in the list of events and test-templates in the set of test-templates of the second predetermined period of time. The hit prediction score indicates a probability of an event being hit by a particular test-template in a future third predetermined period of time based on the template-aware coverage data and similarities between the events and the test-templates. The hit prediction score can be calculated based on the template-aware coverage data from the second predetermined period of time and similarities between the events and the test-templates. In some examples, the hit predictor module 526 includes a classifier trained to generate hit prediction scores using extracted features from template-aware coverage data of the first predetermined period of time and labels extracted from template-aware coverage data of the second predetermined period of time. In some examples, the trained classifier may be trained using regression, such as linear regression or logistic regression. In various examples, the hit predictor module 526 can extract features from the template-aware coverage data of the second predetermined period of time, hash the extracted features, and input the hashed extracted features into the trained classifier. For example, the hit predictor module 526 can extract features from the template-aware coverage data of the second predetermined period of time based on the names of the events and the test-templates. In some examples, the hit predictor module 526 can also generate a policy including unhittable events and transmit the policy to a tester. For example, the unhittable events may be used to avoid testing events that have a lower probability of being hit by any of the current test-templates. The template score generator module 528 can generate a template score for each test-template based on the hit prediction scores for each test-template. In some examples, the template score of a particular test-template is the average of the hit prediction scores associated with that test-template. The template selector module 530 can select a test-template from the set of test-templates based on the template score. In some examples, the template selector module 530 can generate a policy including the selected test-template and transmit the policy to a tester. The tester module 532 can execute the selected test-template to hit an unhit event.

It is to be understood that the block diagram of FIG. 5 is not intended to indicate that the computing device 500 is to include all of the components shown in FIG. 5. Rather, the computing device 500 can include fewer or additional components not illustrated in FIG. 5 (e.g., additional memory components, embedded controllers, modules, additional network interfaces, etc.). Furthermore, any of the functionalities of the receiver module 524, the hit predictor module 526, the template score generator module 528, the template selector module 530, and the tester module 532 may be partially, or entirely, implemented in hardware and/or in the processor 502. For example, the functionality may be implemented with an application specific integrated circuit, logic implemented in an embedded controller, or in logic implemented in the processor 502, among others. In some embodiments, the functionalities of the receiver module 524, hit predictor module 526, the template score generator module 528, the template selector module 530, and the tester module 532 can be implemented with logic, wherein the logic, as referred to herein, can include any suitable hardware (e.g., a processor, among others), software (e.g., an application, among others), firmware, or any suitable combination of hardware, software, and firmware.

The present techniques may be a system, a method or computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD- ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present techniques may be assembler instructions, instruction-set-architecture (ISA) instructions, machine instructions, machine dependent instructions, microcode, firmware instructions, state-setting data, or either code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present techniques.

Aspects of the present techniques are described herein with reference to flowchart illustrations and/or block diagrams of methods, apparatus (systems), and computer program products according to embodiments of the techniques. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Figure 6:
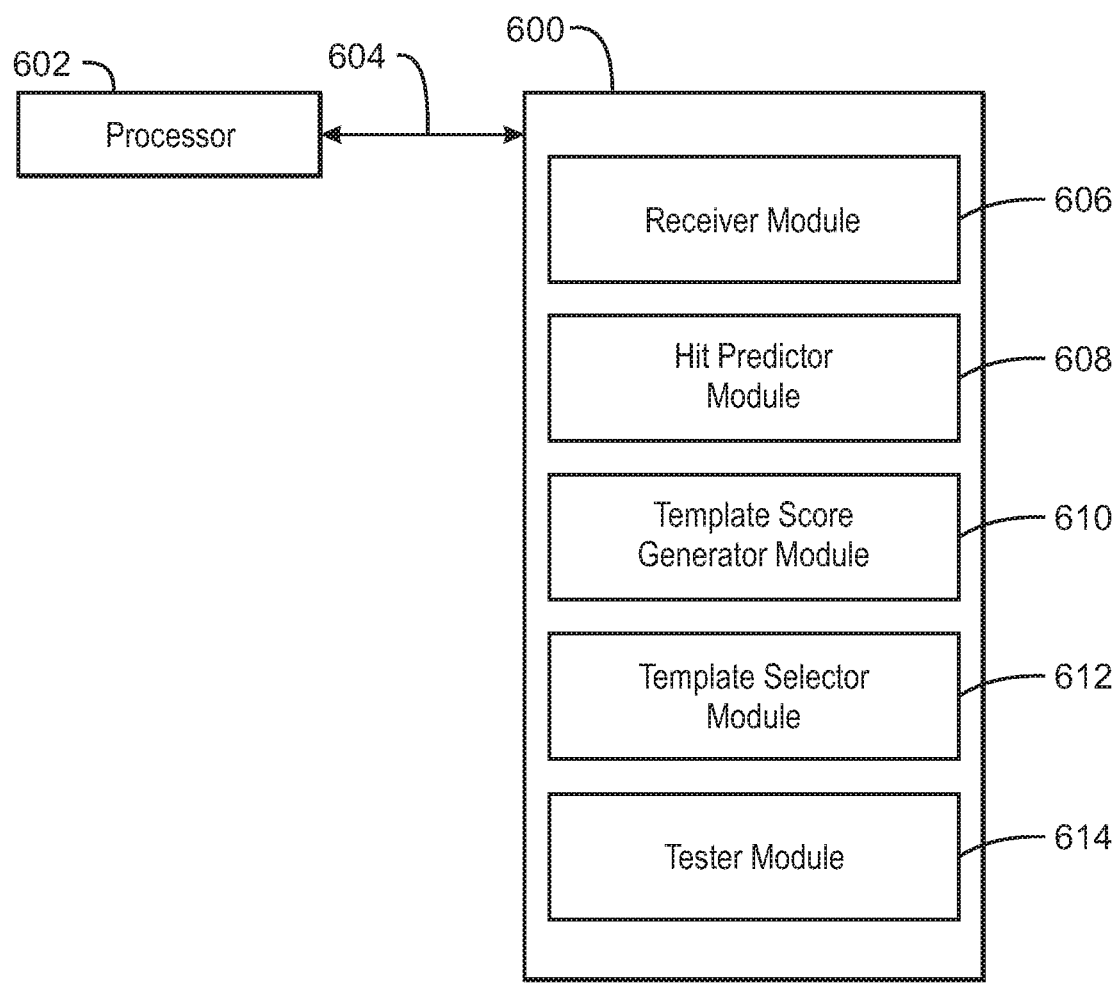
FIG. 6 is an example tangible, non-transitory computer-readable medium that can select and execute test-templates for hitting unhit events.

Referring now to FIG. 6, a block diagram is depicted of an example tangible, non-transitory computer-readable medium 600 that can select and execute test-templates for hitting unhit events. The tangible, non-transitory, computer-readable medium 600 may be accessed by a processor 602 over a computer interconnect 604. Furthermore, the tangible, non-transitory, computer-readable medium 600 may include code to direct the processor 602 to perform the operations of the method 400 of FIG. 4 above.

The various software components discussed herein may be stored on the tangible, non-transitory, computer-readable medium 600, as indicated in FIG. 6. For example, a receiver module 606 includes code to receive a template-aware coverage data that tracks probabilities of events in a list of events being hit for a set of test-templates over a first predetermined period of time and a second predetermined period of time. For example, the predetermined time periods may each be a week. A hit predictor module 608 includes code to generate a hit prediction score for each combination of unhit event in the list of events and each test-template in the set of test-templates of the second predetermined period of time. The hit prediction score indicates a probability of an unhit event being hit by a particular test-template in a future third predetermined period of time based on the template-aware coverage data and similarities between the events and the test-templates. In some examples, the hit predictor module 608 includes code to input the template-aware coverage data into a trained classifier. The trained classifier is trained to generate hit prediction scores using extracted features from template-aware coverage data of the first predetermined period of time. The hit predictor module 608 also includes code to extract features from the template-aware coverage data of the first predetermined period of time, hash the extracted features, and input the hashed extracted features into a trained classifier. In some examples, the hit predictor module 608 may receive the hit prediction scores from the trained classifier. In some examples, the hit predictor module 608 may include code to extract features from the template-aware coverage data of the first predetermined period of time based on the names of the events and the test-templates and extract labels from template-aware coverage data of the second predetermined period of time. A template score generator module 610 includes code to generate a template score for each test-template based on the hit prediction scores for each test-template. The template score generator module 610 also includes code to generate the template score for each test-template by averaging the hit prediction scores associated with each test-template. A template selector module 612 includes code to select a test-template from the set of test-templates based on the template score. A tester module 614 includes code to execute the selected test-template to hit an unhit event. It is to be understood that any number of additional software components not shown in FIG. 6 may be included within the tangible, non-transitory, computer-readable medium 600, depending on the particular application. For example, a training module to train a classifier to generate the hit prediction scores may also be included.

The flowchart and block diagrams in the Figures illustrate the architecture, functionality, and operation of possible implementations of systems, methods, and computer program products according to various embodiments of the present techniques. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions. It is to be understood that any number of additional software components not shown in FIG. 6 may be included within the tangible, non-transitory, computer-readable medium 600, depending on the specific application.

The descriptions of the various embodiments of the present techniques have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising a processor to:
 receive template-aware coverage data that tracks probabilities of events in a list of events being hit for a set of test-templates over a first and second predetermined period of time;
 generate a hit prediction score for each combination of unhit events in the list of events and test-template in the set of test-templates of the second predetermined period of time, wherein the hit prediction score indicates a probability of an unhit event being hit by a particular test-template in a future third predetermined period of time based on the template-aware coverage data and similarities between the events and the test-template, and wherein the hit prediction score is generated by a classifier, the classifier trained using extracted features from template-aware coverage data of the first predetermined period of time and labels extracted from template-aware coverage data of the second predetermined period of times;
 generate a template score for each test-template based on the hit prediction scores for each test-template; and
 select a test-template from the set of test-templates based on the template score.

2. The system of claim 1, wherein the template score of each test-template comprises an average of hit prediction scores associated with each test-template.

3. The system of claim 1, wherein the template-aware coverage data comprises a template-aware coverage matrix.

4. The system of claim 1, wherein the processor is to generate a policy comprising the selected test-template and transmit the policy to a tester.

5. The system of claim 1, wherein the processor is to execute the selected test-template to hit an unhit event.

6. The system of claim 1, wherein the processor is to generate a policy comprising unhittable events and transmit the policy to a tester.

7. A computer-implemented method, comprising:
 receiving, via a processor, a template-aware coverage data that tracks probabilities of events in a list of events being hit for a set of test-templates over first and second predetermined period of time;
 generating, via the processor, a hit prediction score for each combination of unhit event in the list of events and test-template in the set of test-templates of the second predetermined period of time, wherein the hit prediction score indicates a probability of an unhit event being hit by a particular test-template in a future third predetermined period of time based on the template-aware coverage data and similarities between the events and the test-templates, wherein generating the hit prediction score comprises inputting the template-aware coverage data into a trained classifier, the trained classifier trained to generate hit prediction scores using extracted features from template-aware coverage data of a first predetermined period of time and labels extracted from template-aware coverage data of the second predetermined period of time;
 generating, via the processor, a template score for each test-template based on the hit prediction scores for each test-template; and
 selecting, via the processor, a test-template from the set of test-templates based on the template score.

8. The computer-implemented method of claim 7, comprising executing, via the processor, the test-template to hit an unhit event during testing, wherein an amount of a resource provided to the test-template during testing is based on the template score associated with the test-template.

9. The computer-implemented method of claim 7, comprising generating, via the processor, a policy comprising the test-template and transmitting the policy to a tester, wherein the test-template is included in the policy in response to detecting that the template score of the test-template exceeds a threshold score.

10. The computer-implemented method of claim 7, wherein generating the hit prediction score comprises extracting features from the template-aware coverage data of the first predetermined period of time, hashing the extracted features, and inputting the hashed extracted features into a trained classifier.

11. The computer-implemented method of claim 7, wherein generating the hit prediction score comprises extracting features from the template-aware coverage data of the first predetermined period of time based on names of the events and the test-templates.

12. The computer-implemented method of claim 7, wherein generating the template score for each test-template comprises averaging hit prediction scores associated with each test-template.

13. A computer program product for selecting test-templates, the computer program product comprising a computer-readable storage medium having program code embodied therewith, wherein the computer readable storage medium is not a transitory signal per se, the program code executable by a processor to cause the processor to:
receive a template-aware coverage data that tracks probabilities of events in a list of events being hit for a set of test-templates over a first predetermined period of time and a second predetermined period of time;
input the template-aware coverage data into a trained classifier, the trained classifier trained to generate hit prediction scores using extracted features from template-aware coverage data of the first predetermined period of time and labels extracted from template-aware coverage data of the second predetermined period of time;
generate, via the trained classifier, a hit prediction score for each combination of unhit event in the list of events and test-template in the set of test-templates of the second predetermined period of time, wherein the hit prediction score indicates a probability of an unhit event being hit by a particular test-template in a future third predetermined period of time based on the template-aware coverage data and similarities between the events and the test-templates;
generate a template score for each test-template based on the hit prediction scores for each test-template; and
select a test-template from the set of test-templates based on the template score.

14. The computer program product of claim 13, further comprising program code executable by the processor to execute the selected test-template to hit an unhit event.

15. The computer program product of claim 13, further comprising program code executable by the processor to extract features from the template-aware coverage data of the first predetermined period of time, hash the extracted features, and input the hashed extracted features into a trained classifier.

16. The computer program product of claim 13, further comprising program code executable by the processor to extract features from the template-aware coverage data of the first predetermined period of time based on names of the events and the test-templates.

17. The computer program product of claim 13, further comprising program code executable by the processor to generate the template score for each test-template by averaging hit prediction scores associated with each test-template.

* * * * *